(12) United States Patent
Kim

(10) Patent No.: US 11,324,133 B2
(45) Date of Patent: May 3, 2022

(54) ATTACHABLE/DETACHABLE DISPLAY DEVICE COMPRISING POLARIZING FILM

(71) Applicant: Young Su Kim, Suwon-si (KR)

(72) Inventor: Young Su Kim, Suwon-si (KR)

( * ) Notice: Subject to any disclaimer, the term of this patent is extended or adjusted under 35 U.S.C. 154(b) by 124 days.

(21) Appl. No.: 16/765,010

(22) PCT Filed: Nov. 21, 2018

(86) PCT No.: PCT/KR2018/014303
§ 371 (c)(1),
(2) Date: May 18, 2020

(87) PCT Pub. No.: WO2019/103439
PCT Pub. Date: May 31, 2019

(65) Prior Publication Data
US 2020/0323093 A1  Oct. 8, 2020

(30) Foreign Application Priority Data

Nov. 22, 2017 (KR) .................. 10-2017-0156072
Nov. 19, 2018 (KR) .................. 10-2018-0142260

(51) Int. Cl.
*H05K 5/03* (2006.01)
*G06F 3/041* (2006.01)
*H05K 5/00* (2006.01)

(52) U.S. Cl.
CPC ............ *H05K 5/03* (2013.01); *G06F 3/041* (2013.01); *H05K 5/0017* (2013.01)

(58) Field of Classification Search
CPC .. G02B 1/18; G02B 27/28; G02B 5/30; G06F 3/041; G09F 9/30; H05K 5/0017; H05K 5/03
See application file for complete search history.

(56) References Cited

U.S. PATENT DOCUMENTS

2012/0328800 A1* 12/2012 Yoon .................. C09J 133/062
428/1.55
2014/0211105 A1* 7/2014 Cho .................. G02F 1/13338
349/12

FOREIGN PATENT DOCUMENTS

| KR | 20110088772 | 8/2011 |
| KR | 20140096596 | 8/2014 |
| KR | 101574923 | 12/2015 |

(Continued)

OTHER PUBLICATIONS

International Search Report—PCT/KR2018/014303 dated Feb. 27, 2019.

*Primary Examiner* — Nelson M Rosario
(74) *Attorney, Agent, or Firm* — Cantor Colburn LLP

(57) ABSTRACT

Provided is an attachable/detachable display device comprising a polarizing film, the display device allowing a damaged window to be easily replaced, the window to be simply detached therefrom, a manufacturing process therefor to be simplified, and manufacturing unit costs therefor to be lowered, and being variously designable. The display device comprises: a touch screen; the polarizing film; the window; and an adhesiveness adjusting layer, which is on any one of the polarizing film, the touch screen and a touch screen cover layer attached to the touch screen, and is on at least one side of the polarizing film, wherein the adhesiveness adjusting layer adjusts an adhesive force of an attachable/detachable layer having an adhesive force of 0.1 gf/25 mm to 500 gf/25 mm.

7 Claims, 6 Drawing Sheets

(56) References Cited

FOREIGN PATENT DOCUMENTS

| KR | 101675225 | 11/2016 |
| KR | 20170015825 | 2/2017 |

\* cited by examiner (a)

(b)

(c)

(d)

(a)

(b)

(c)

(d)

(a)

(b)

(c)

ATTACHABLE/DETACHABLE DISPLAY DEVICE COMPRISING POLARIZING FILM

TECHNICAL FIELD

The present invention relates to a display device, and more specifically, to a display device including a polarizing film and having an attaching and detaching function.

BACKGROUND ART

In a display device, a display such as a liquid crystal display (LCD), an organic light emitting diode (OLED), an electrophoretic display (EPD), or a micro light emitting diode (Micro LED) forms a screen. Such a display device is applied to various video screen devices. Meanwhile, the device employs a touch screen to provide convenience of handling, and applies a polarizing film that can separately pass or block vertically or horizontally polarized waves of incident light. Usage of the polarizing film is expanded to changing the property of light, in addition to separating the polarized waves. A window made of tempered glass or transparent polymer resin is disposed on the front surface of the touch screen. The window is divided into a display unit and a bezel unit of a printed edge, and protects the display device from damage caused by external impact or contact. The window is bonded and fixed to the touch screen using an optically clear adhesive (OCA), ultraviolet curable adhesive or the like. Recently, with the advent of flexible and curved displays, windows corresponding thereto are emerging.

FIG. 1 is a cross-sectional view schematically showing a typical example of a display device to which a conventional polarizing film is applied. At this point, the display device includes a curved device, as well as a flat one shown in the figure. According to FIG. 1, a conventional display device has a structure sequentially stacking a touch screen 510, a bonding layer 520, a polarizing film 530, a bonding layer 520, and a window 540 on a display 500 such as an LCD, an OLED or the like. The bonding layer 520 is a highly transparent adhesive having high transparency and high adhesive force, and is located between the touch screen 510 and the polarizing film 530 and between the polarizing film 530 and the window 540.

Meanwhile, Korean Patent Registration No. 10-1574923 proposes a display device including a detachable window and an attaching and detaching method thereof. Specifically, the patent may easily replace a damaged window, easily separate the window from the display device, simplify the process of manufacturing the display device, reduce the manufacturing cost, and diversify the design. Similarly, a display device capable of attaching and detaching a touch screen is also possible. In addition, according to the patent, the display device may be manufactured by obtaining and assembling a window, a touch screen and a display through different channels, such as different manufacturers or products. For example, product A of company A, product B of company B, and product C of company C may be obtained as the window, the touch screen and the display through different purchase channels respectively and assembled as a display device including A, B and C.

However, for the diverse utilization suggested in the patent, a method using a polarizing film is not sufficient. Accordingly, a specific method for properly applying the polarizing film to the patent is required. Generally, the polarizing film is located between the touch screen and the window.

DISCLOSURE OF INVENTION

Technical Problem

Therefore, the present invention has been made in view of the above problems, and it is an object of the present invention to provide a detachable display device including a polarizing film, which can easily replace a damaged window, easily separate the window from the display device, simplify the process of manufacturing the display device, reduce the manufacturing cost, and diversify the design.

Technical Solution

To accomplish the above object, according to one aspect of the present invention, there is provided a detachable display device including a touch screen, a polarizing film, and a window, the device comprising: an adhesion control layer existing on at least one among the polarizing film, the touch screen, and a touch screen cover layer attached to the touch screen, and existing on least one side of the polarizing film, wherein the adhesion control layer adjusts the adhesive force of a detachable layer having an adhesive force of 0.1 gf/25 mm to 500 gf/25 mm.

In the device of the present invention, the adhesion control layer may be any one among an adhesion control pattern, a fine depression-protrusion pattern, and a combination pattern of these. The adhesion control pattern may be divided into a first region having a small contact angle and a second region having a large adhesion angle, and the first region may be coated to have a small adhesion angle or expose any one among the polarizing film, the touch screen, and the touch screen cover layer attached to the touch screen. The adhesion control pattern may be divided into a first region having a small contact angle and a second region having a large adhesion angle, and the second region may include a fluorine-based resin or a silicone-based resin, or a fluorine-based resin or a silicone-based resin on a deposition layer made of titania ($TiO_2$) or silica ($SiO_2$). The adhesion control pattern is arranged in a line shape, a lattice shape, an island shape, or a combination of these.

In the device of the present invention, the fine depression-protrusion pattern includes depressions and protrusions having an angle, a curvature or a combination of these on a cross section. The fine depression-protrusion pattern may be arranged in a line shape, a lattice shape, an island shape, or a combination of these. The fine depression-protrusion pattern is divided into a flat unit without having the fine depressions and protrusions, and a depression-protrusion unit having the fine depressions and protrusions. In the fine depression-protrusion pattern, the depression-protrusion unit corresponds to an edge or ups and downs of a curved surface.

In the device of the present invention, the detachable layer may be any one among a surface-modified sheet and a detachable sheet. The surface-modified sheet may be manufactured by performing corona treatment, plasma treatment, or a continuous treatment thereof on the surface of a transparent polymer film.

The detachable sheet is in the form of a sheet and has an adhesive property.

Advantageous Effects

According to the detachable display device including a polarizing film of the present invention, as the polarizing film, to and from which a detachable layer having an adhesive force of 0.1 gf/25 mm to 500 gf/2 mm is attached and detached, is applied to a display, there is an effect of easily replacing a damaged polarizing film together with a window, easily separating the window, simplifying the process of manufacturing the display device, reducing the manufacturing cost, and diversifying the design.

DESCRIPTION OF SYMBOLS

Figure 1:
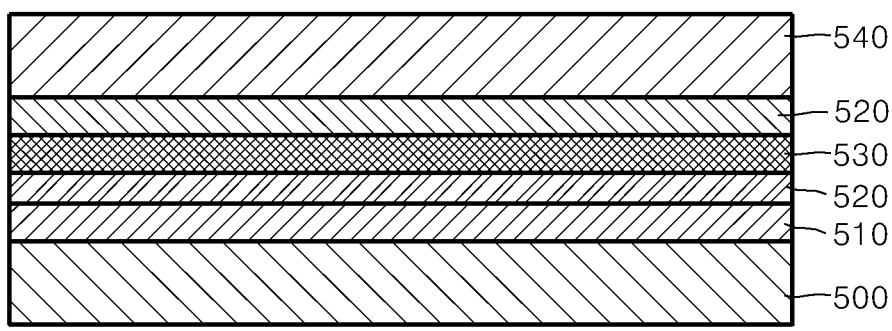
FIG. 1 is a cross-sectional view schematically showing a typical example of a display device to which a conventional polarizing film is applied.

10: Display 20: Touch screen
30: Bonding layer 40: Polarizing film
50: Adhesion control layer 51: Adhesion control pattern
52: Fine depression-protrusion pattern
60: Detachable layer 70: Window

BEST MODE FOR CARRYING OUT THE INVENTION

Hereinafter, the preferred embodiments of the present invention will be described in detail, with reference to the accompanying drawings. The embodiments described below may be modified in various other forms, and the scope of the present invention is not limited to the embodiments described below in detail. The embodiments of the present invention are provided to more completely explain the present invention to those skilled in the art. In addition, in the drawings, the thicknesses of films (layers, patterns) and regions may be exaggerated for clarity. In addition, if a film (layer, pattern) is mentioned as being 'above', 'top', 'bottom', 'one side' of another film (layer, pattern), it is formed directly on the other film (layer, pattern), or other films (layers, patterns) may be interposed therebetween.

An embodiment of the present invention presents a display device which can easily replace a damaged polarizing film together with a window, easily separate the window, simplify the process of manufacturing the display device, reduce the manufacturing cost, and diversify the design, by applying a polarizing film having a detachable layer formed to have an adhesive force of 0.1 gf/25 mm to 500 gf/25 mm to a display. At this point, the window and the polarizing film are attached to and detached from the touch screen, or the window is attached to and detached from the polarizing film. The detachable layer of the present invention is limited to be attached to and detached from a polarizing film or a touch screen, and is clearly distinguished from an existing window protection film attached to and detached from a window.

The display device applied to an embodiment of the present invention refers to all image processing devices such as a mobile device, an information processing terminal, a television, and the like. The mobile device may be a cellular phone, a smartphone, a tablet or the like, and the information processing terminal may be an ATM, a kiosk or the like. The display of the display device may be a flat or curved one, or may be a flexible one. The image processing device includes a window, a touch screen and a display. Accordingly, the window generally refers to a window of a mobile devices, a windows of an information processing terminal, and windows of all image processing devices such as a television and the like. Similarly, the touch screen and the display also refer to touch screens and displays applied to all image processing devices.

Figure 2:
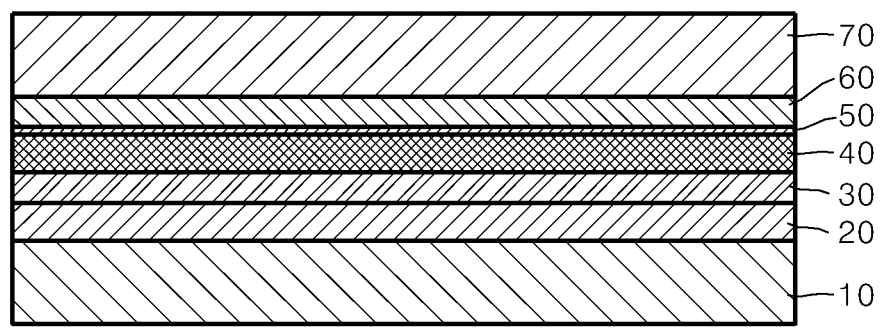
FIG. 2 is a view showing a detachable first display device according to the present invention.

FIG. 2 is a view showing a first display device 100 according to an embodiment of the present invention. However, it does not express a view of a strict meaning, and there may be components that do not appear in the view for convenience of explanation.

According to FIG. 2, the first display device 100 is formed by sequentially stacking a display 10 such as an LCD/OLED/micro-LED, a touch screen 20, a bonding layer 30, a polarizing film 40, an adhesion control layer 50, a detachable layer 60, and a window 70. The display 10 includes a liquid crystal display (LCD), an organic light emitting diode (OLED), an electrophoretic display (EPD) and the like, and quantum dots are also utilized. The touch screen 20 has conductive patterns formed on one side or both sides of an insulating layer made of metal oxide or plastic. Metal oxide is mainly applied to the conductive pattern, and the metal oxide includes ITO, ATO, ZnO, Cu, conductive polymer, silver nanowire or the like. A touch screen cover layer made of a material such as glass or the like may be attached to the touch screen 20. For example, a thermosetting adhesive or an ultraviolet curable adhesive may be used for the bonding layer 30. However, the bonding layer 30 is not limited thereto, and an OCA tape or the like may also be used.

The window 70 may use a transparent material without limit. For example, the window 70 may include a glass substrate or a plastic substrate. Specifically, the glass substrate may be tempered glass, and the plastic substrate may include any one or any one or more among polyethylene terephthalate (PET), polyethylene naphthalate (PEN), polyether sulfone (PES), polyimide (PI), polyarylate (PAR), polycarbonate (PC), polymethyl methacrylate (PMMA), and cycloolefin copolymer (COC). The window may also be a stacked structure in which the tempered glass and the plastic substrate are formed as multiple layers.

The window 70 may have a print layer transparent or implementing various functions. The print layer may apply any one or any one or more coatings among transparent, translucent and color coatings. The print layer may be formed by silk printing, inkjet printing using UV, inkjet printing using thermosetting, or transfer printing. A functional coating layer such as anti-fingerprint coating, antimicrobial coating, or anti-scratch coating may be formed on the window 70. The functional coating layer may be formed by wet coating of applying a coating liquid or dry coating such as deposition. In addition, the characteristics such as shielding, anti-reflection, blue light blocking, electromagnetic wave blocking, privacy and the like may be provided on the bottom of the glass substrate or the plastic substrate of the window 70. In addition, an opening for exposing a button, a camera, a speaker or the like may be formed in the window.

The polarizing film 40 is a film having a property that can separate vertically and horizontally polarized waves of incident light and pass or block the separated waves. The polarizing film 40 is an optical film used for thin film transistor liquid crystal display (TFT-LCD) devices of notebook computers and monitors, camera filters for special effects, stereoscopic movie glasses, and OLEDs to enhance visibility. For example, the intensity of light emitted from the backlight of a liquid crystal display (LCD) module is uniform in all directions, whereas the polarizing film transmits only the light vibrating in the same direction as the polarization axis among the emitted light, and absorbs or reflects the others to generate polarized light in a specific direction. When the polarized light passes through the LCD liquid crystal, brightness of pixels is changed as the arranging direction of the liquid crystal is electrically adjusted for each pixel. Recently, in the OLED or the like, usage of the polarizing film 40 is expanded to changing the property of light, in addition to separating the polarized waves.

Meanwhile, the polarizing film 40 may prevent shattering of a window by itself. Of course, although there may be a shatterproof film on the bottom surface of the window, when the polarizing film 40 is provided, the shatterproof film on the bottom surface of the window 70 may be omitted. The polarizing film 40 is located between the touch screen 20 or the touch screen cover layer and the window 70.

Although any transparent material may be used as the detachable layer 60, it may be an adhesive made by mixing a crosslinking agent with a thermosetting resin, i.e., an acrylic polymer, a silicon polymer or a urethane polymers, or an ultraviolet curable resin, a mixture of these, or a copolymer of these. The detachable layer 60 may be a single layer or a multilayer made of different materials in each layer. In the multilayer, a material which forms each layer may be appropriately selected according to the environment in which the detachable layer of the present invention is used. Thickness of the detachable layer 60 is acceptable if the adhesion is sufficient, and thickness of 10 to 200 micrometers is appropriate. It is apparent that the thickness can be obtained through repeated experiments by those skilled in the art.

When the adhesive force of the detachable layer 60 is about 0.1 gf/25 mm to 500 gf/25 mm, the detachable layer 60 has a self-adhesive force. The self-adhesive force is a property of the detachable layer 60 adhering itself without bubbles by simply putting the detachable layer 60 on the polarizing film 40.

Meanwhile, an adhesion control layer 50 may be added on the polarizing film 40 to facilitate attachment and detachment. The adhesion control layer 50 increases the slip property by lowering frictional force. The adhesion control layer 50 allows the detachable layer 60 to be easily attached to and detached from the polarizing film 40. The adhesion control layer 50 may use a coating material of fluorine-based resin or silicon-based resin. The adhesion control layer 50 may be formed by depositing titania ($TiO_2$) or silica ($SiO_2$) on the touch screen 20 or the touch screen cover layer and then coating a fluorine-based resin or a silicon-based resin on the deposited touch screen 20 or touch screen cover layer. At this point, the fluorine-based resin or the silicon-based resin may be formed in an easy cleaning coating (ECC) method. If the adhesion control layer 50 is applied, generation of bubbles can be suppressed more effectively when the detachable layer 60 is attached to the polarizing film 40. In addition, the adhesion control layer 50 allows a consumer to easily attach and detach the window 70 to and from the polarizing film 40 by himself or herself without a tool.

The adhesive force according to an embodiment of the present invention may vary depending on the presence of the adhesion control layer 50. The adhesive force of attachment is 0.5 gf/25 mm to 500 gf/25 mm when the adhesion control layer 50 exists, whereas an adhesive force of 0.1 gf/25 mm to 200 gf/25 mm is needed when the adhesion control layer 50 does not exist. If there exists an adhesion control layer 50 when a detachable layer 60 of the same material and thickness is provided, it is easier to attach the window 70 to the polarizing film 40 without bubbles. In addition, owing to the effect of the adhesion control layer 50, separation of the window 70 occurs relatively easily.

Figure 3:
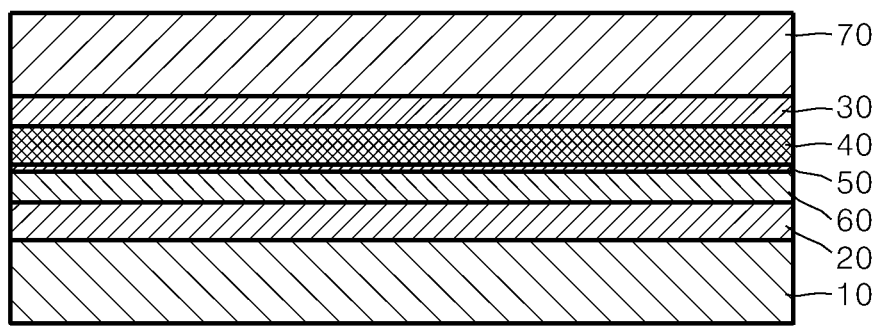
FIG. 3 is a view showing a detachable second display device according to the present invention.

FIG. 3 is a view showing a detachable second display device 200 according to an embodiment of the present invention. The second display device 200 is the same as the first display device 100 except that the locations of the bonding layer 30, the adhesion control layer 50, and the detachable layer 60 are changed. Accordingly, the detailed description of the same reference numerals will be omitted.

According to FIG. 3, the second display device 200 is formed by sequentially stacking a display 10 such as LCD/OLED/micro-LED, a touch screen 20, a detachable layer 60, an adhesion control layer 50, a polarizing film 40, a bonding layer 30, and a window 70. At this point, a touch screen cover layer made of a material such as glass or the like may be attached to the touch screen 20. The display 10, the touch screen 20, the touch screen cover layer, the detachable layer 60, the adhesion control layer 50, the polarizing film 40, the bonding layer 30, and the window 70 are the same as described above in the first display device 100. The second display device 200 may apply the adhesion control layer 50 to more effectively suppress generation of bubbles when the polarizing film 40 is attached to the touch screen 20 or the touch screen cover layer. In addition, the adhesion control layer 50 allows a consumer to easily attach and detach the window 70, to which the polarizing film 40 is attached, to and from the touch screen 20 by himself or herself without a separate tool.

Meanwhile, although the adhesion control layer 50 is located, for example, on the polarizing film 40 in the second display device 200, in some cases, the adhesion control layer 50 may be located on the touch screen 20 or the touch screen cover layer. In this case, the detachable layer 60 is formed on the polarizing film 40.

Figure 4:
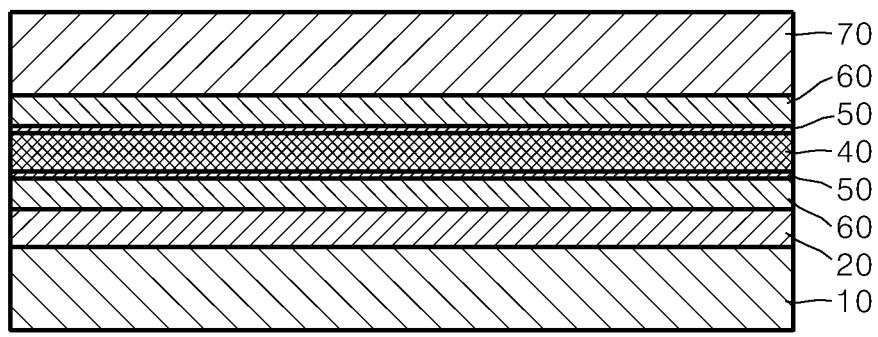
FIG. 4 is a view showing a detachable third display device according to the present invention.

FIG. 4 is a view showing a detachable third display device 300 according to an embodiment of the present invention. The third display device 300 is the same as the first display device 100 except that the adhesion control layer 50 and the detachable layer 60 are disposed on both sides of the polarizing film 40, respectively. Accordingly, the detailed description of the same reference numerals will be omitted.

According to FIG. 4, the third display device 300 is formed by sequentially stacking a display 10 such as LCD/OLED/micro-LED, a touch screen 20, a detachable layer 60, an adhesion control layer 50, a polarizing film 40, an adhesion control layer 50, a detachable layer 60, and a window 70. At this point, a touch screen cover layer made of a material such as glass or the like may be attached to the touch screen 20. The display 10, the touch screen 20, the touch screen cover layer, the detachable layer 60, the adhesion control layer 50, the polarizing film 40, and the window 70 are the same as described above in the first display device 100. When the adhesion control layer 50 is applied to the third display device 300, generation of bubbles may be suppressed more effectively when the detachable layer 60 is attached to the touch screen 20 or the touch screen cover layer or attached to polarizing film 40. In addition, the adhesion control layer 50 allows a consumer to easily attach and detach the window 70 and the window 70, to which the polarizing film 40 is attached, by himself or herself without a separate tool.

Meanwhile, although the adhesion control layer 50 is located, for example, on the polarizing film 40 in the third display device 300, in some cases, the adhesion control layer 50 may be located on the touch screen 20 or the touch screen cover layer. In this case, the detachable layer 60 is formed on the polarizing film 40.

When the embodiment of the present invention is applied to a flexible display device, the adhesion control layer 50 that induces a low adhesive force is very important. That is, a phenomenon of pushing the detachable layer 60 with a low adhesive force occurs, and a slippery phenomenon of the adhesion control layer 50 occurs. When the flexible display device is replaced or bent, reliability of the adhesive force is improved due to the flexibility of the detachable layer 60. In a preferred embodiment of the present invention, it may be applied to a display device, which can be attached and detached using the detachable layer 60 and the adhesion control layer 50 having an adhesive force of 200 gf/25 mm or less on a polarizing film 40 of single side adhesion-single side adhesion, and a module of the display device.

Figure 5:
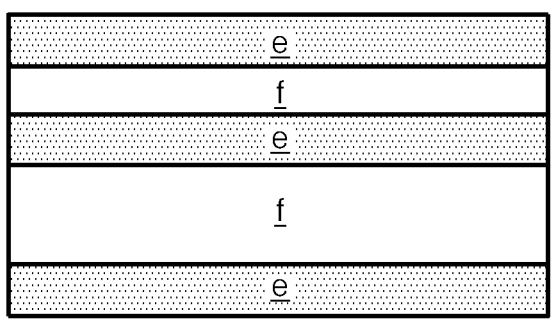
FIG. 5 is plan views showing examples of adhesion control patterns applied to a display device according to the present invention.
Figure 5:
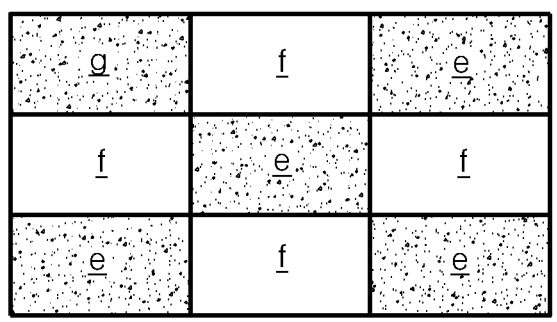
Figure 5:
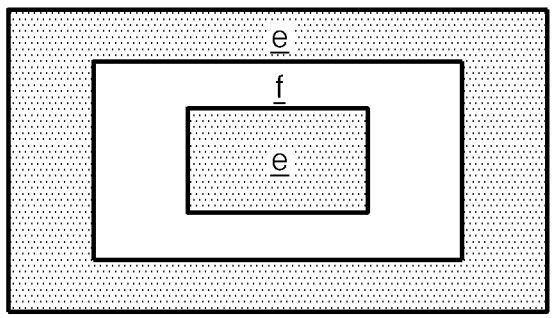
Figure 5:
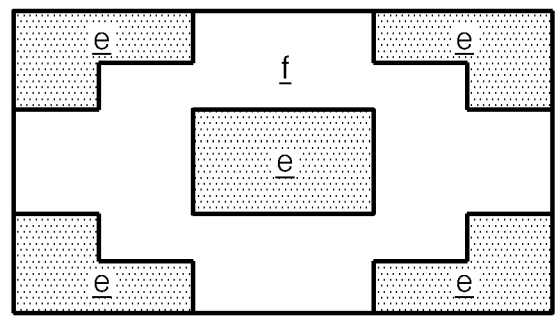
Figure 6:
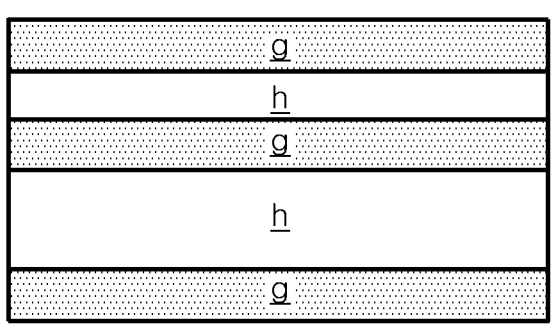
FIG. 6 is plan views showing examples of a fine depression-protrusion pattern applied to a display device according to the present invention.
Figure 6:
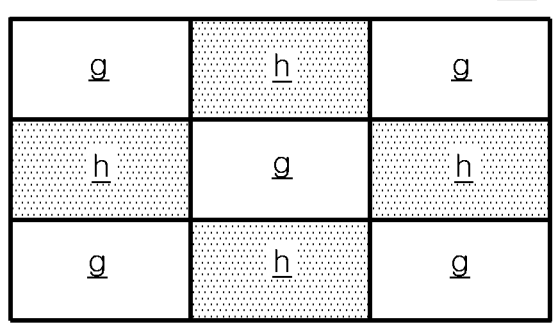
Figure 6:
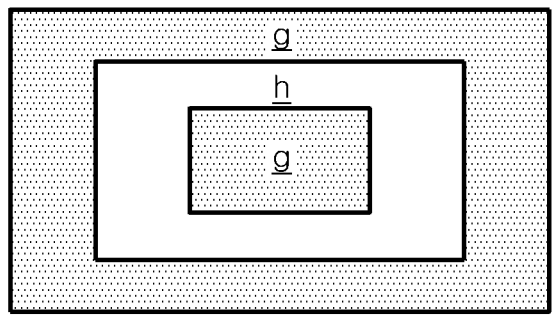
Figure 6:
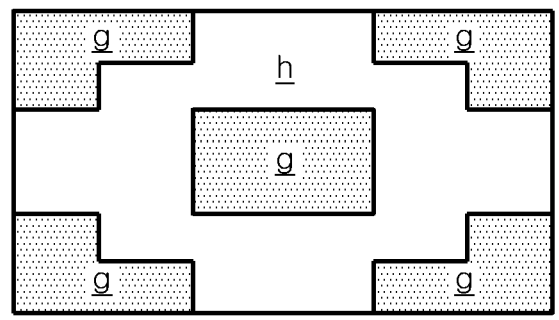
Figure 7:
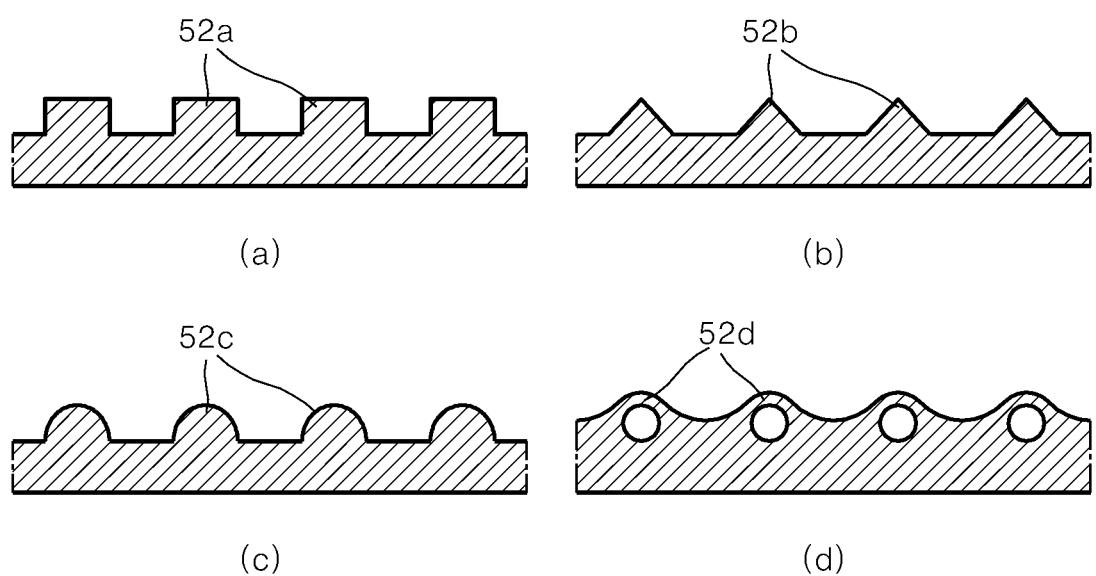
FIG. 7 is cross-sectional views showing examples of fine depressions and protrusions of a fine depression-protrusion pattern applied to a display device according to an embodiment of the present invention.
Figure 8:
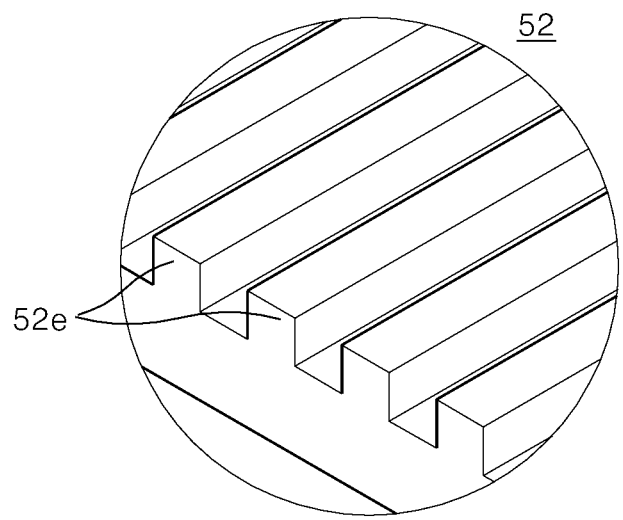
FIG. 8 is cross-sectional views showing pattern examples of a fine depression-protrusion pattern applied to a display device according to an embodiment of the present invention.
Figure 8:
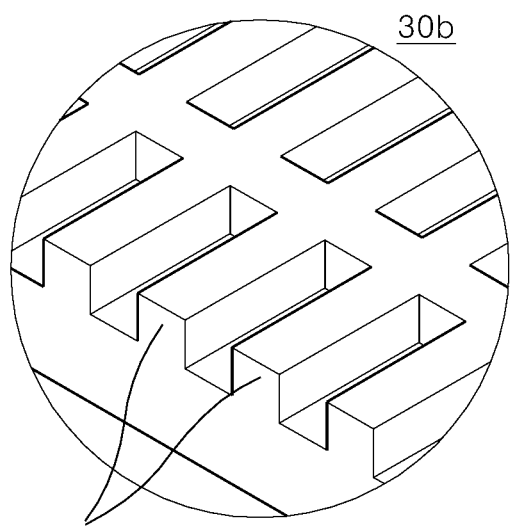
Figure 8:
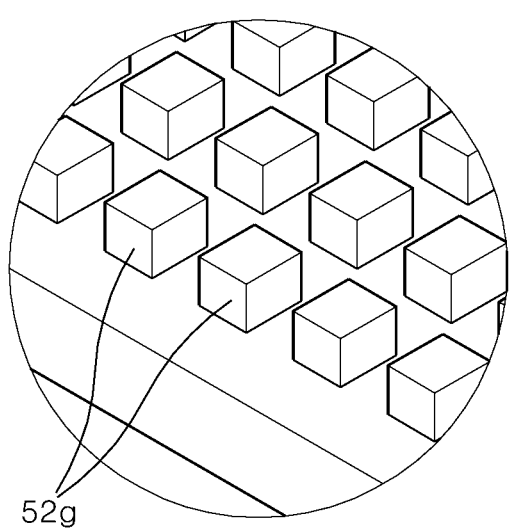

Meanwhile, the adhesion control layer 50 of the embodiment of the present invention may adjust the adhesive force in various ways. Hereinafter, an example of adjusting the adhesive force of the adhesion control layer 50 will be described. FIG. 5 is a view showing examples of using an adhesion control pattern, and FIGS. 6 to 8 are views showing examples of using a fine depression-protrusion pattern. Accordingly, the adhesion control pattern and the fine depression-protrusion pattern may be examples of the adhesion control layer 50. In addition, although the adhesion control pattern and the fine depression-protrusion pattern will be described as being formed on the polarizing film 40, the patterns may be formed on the touch screen 20 or the touch screen cover layer.

FIG. 5 is plan views showing examples of an adhesion control pattern 51 applied to a display device according to an embodiment of the present invention. Here, it is only a few examples of the adhesion control pattern 51, and may be variously modified within the scope of the present invention. At this point, the display devices will be described with reference to FIGS. 2 to 4.

According to FIG. 5, in the drawing, the first region (e) is a portion having a high adhesive force due to a small contact angle, and the second region (f) is a portion having a low adhesive force due to a large contact angle. At this point, the area occupied by the second region (f) may be 5 to 95% of the total area of the first region (e) and the second region (f). The contact angle of the first region (e) is approximately 30 degrees or less, and the adhesive force is relatively high. That is, the adhesive force of the detachable layer 60 is maintained as is, or the adhesive force is increased at the conjunction of the detachable layer 60 and the polarizing film 40.

The first region (e) may expose the polarizing film 40 as is, or may be coated to reduce the contact angle. When the polarizing film 40 is exposed, the detachable layer 60 is attached to the polarizing film 40 while maintaining the adhesive force as is. Particularly, when the display devices 100, 200 and 300 of the present invention form a curved surface, most of the ups and downs may overcome the spring-back phenomenon by such a mechanism, and attach and detach the detachable layer 60 to and from the polarizing film 40. When the ups and downs of the display devices 100, 200 or 300 are severe or the shape is complicated, it may be difficult to attach the detachable layer 60 to the polarizing film 40. In order to overcome this difficulty, a coating for artificially reducing the contact angle may be performed, or fine depressions and protrusions described below may be provided. Various methods may be applied as a method of the coating for reducing the contact angle within the scope of the present invention, and for example, an organosilicon compound may be coated to increase the adhesive force by reducing the contact angle.

The second region (f) provides anti-fingerprint, anti-pollution, and slip property, and may be formed by depositing titania ($TiO_2$) or silica ($SiO_2$) on the polarizing film 40 and then coating a fluorine-based resin or a silicon-based resin on the deposited polarizing film 40. At this point, the fluorine-based resin or the silicon-based resin may be formed in an easy cleaning coating (ECC) method. The contact angle of the second region (f) is approximately 100 degrees or more, and the adhesive force is relatively low. That is, the adhesive force between the detachable layer 60 and the polarizing film 40 is weakened. When the second region (f) is applied, generation of bubbles may be more effectively suppressed when the detachable layer 60 is attached to the polarizing film 40. In addition, the second region (f) allows a consumer to easily attach and detach the window 70 or the like to and from the polarizing film 40 by himself or herself without a tool.

As an example of the adhesion control pattern 51, a first region (e) and a second region (f) that can be cured are disposed in the shape of a stripe (a). At this point, the first region (e) is preferably located on the edge of the polarizing film 40. For example, the first region (e) may be mainly disposed in the bezel region. In this way, the widths of the first region (e) and the second region (f) constituting the adhesion control pattern 51 may be appropriately adjusted, respectively. Although the shape of the strips in the drawing is a rectangular shape having a predetermined thickness, in some cases, the shape may be modified to a wave shape or the like.

As another example of the adhesion control pattern 51, the first region (e) and the second region (f) are disposed in each cell in the shape of a lattice (b). At this point, the first region (e) is preferably located near the corner of the polarizing film 40. For example, the first region (e) may be mainly disposed in the bezel region. In this way, the areas of the first region (e) and the second region (f) constituting the adhesion control pattern 51 may be appropriately adjusted, respectively. Although the shape of the strips in the drawing is a rectangular shape having a predetermined width, in some cases, it may include a shape such as a circle, an ellipse, a wave or the like.

As still another example of the adhesion control pattern 51, the first region (e) and the second region (f) closed in the shape of a fence are disposed (c). At this point, the first region (e) is preferably located at the corner or the edge of the polarizing film 40. For example, the first region (e) may be mainly disposed in the bezel region. In this way, the areas of the first region (e) and the second region (f) constituting the adhesion control pattern 51 may be appropriately adjusted, respectively. Although the shape of the fence in the drawing is a rectangular shape having a predetermined thickness, in some cases, the shape may be modified to a wave shape or the like.

As still another example of the adhesion control pattern 51, one among the first region (e) and the second region (f) passes through some of the closed fence (d). At this point, the first region (e) is preferably located near the corner of the polarizing film 40. For example, the first region (e) may be mainly disposed in the bezel region. In this way, the areas of the first region (e) and the second region (f) constituting the adhesion control pattern 51 may be appropriately adjusted, respectively. Although the shape of the fence in the drawing is a rectangular shape having a predetermined thickness, in some cases, the shape may be modified to a wave shape or the like.

The adhesion control pattern 51 according to an embodiment of the present invention allows to freely adjust the attaching and detaching adhesive force. When the areas of the first region (e) and the second region (f) having different adhesive forces are adjusted, the adhesive force of the adhesion control pattern 51 is changed. In addition, since the adhesive forces of the first region (e) and the second region (f) of the adhesion control pattern 51 are different from each other, the possibility of removing bubbles increases.

FIG. 6 is plan views showing examples of a fine depression-protrusion pattern 52 applied to a display device according to an embodiment of the present invention. The fine depression-protrusion pattern 52 controls the adhesive force of the adhesion control layer 50. It merely shows some examples of the fine depression-protrusion pattern 52 herein, and various modifications can be made within the scope of the present invention. At this point, the display devices will be described with reference to FIGS. 2 to 4. At this point, (g) may be a flat unit without having fine depressions and protrusions, and (h) may be a depression-protrusion unit having fine depressions and protrusions. Since the adhesive of the detachable layer 60 penetrates into the space of the fine depressions and protrusions, the bonding force with the detachable layer 60 is greater than that of the flat unit (g). That is, the depression-protrusion unit (h) has an anchor effect when it combines with the detachable layer 60.

According to FIG. 6(a), in the fine depression-protrusion pattern 52, a flat unit (g) and a curable depression-protrusion unit (h) are disposed in the shape of a stripe (a). At this point, the proportion occupied by the flat unit (g) may be 5 to 95% of the total area of the flat unit (g) and the depression-protrusion unit (h). The order of disposing the flat unit (g) and the depression-protrusion unit (h) may vary depending on the shape of the polarizing film 40 to which the fine depression-protrusion pattern 52 of the present invention is applied. For example, when the bezel region is relatively wide, the depression-protrusion unit (h) may be mainly disposed in the bezel region. In this way, the widths of the flat unit (g) and the depression-protrusion unit (h) constituting the fine depression-protrusion pattern 52 may be appropriately adjusted, respectively. Although the shape of the strip in the drawing is a rectangular shape having a predetermined thickness, in some cases, the shape may be modified to a wave shape or the like.

According to FIG. 6(b), the fine depression-protrusion pattern 52 is formed in the shape of a lattice, and the flat units (g) or the depression-protrusion units (h) is disposed in each cell (b). The order of disposing the flat unit (g) and the depression-protrusion unit (h) may vary depending on the shape of the polarizing film 40 to which the fine depression-protrusion pattern 52 of the present invention is applied. For example, when the bezel region is large, the depression-protrusion unit (h) may be mainly disposed in the bezel region. In this way, the areas of the flat unit (g) and the depression-protrusion unit (h) constituting the fine depression-protrusion pattern 52 may be appropriately adjusted, respectively. Although the shape of the cells in the drawing is a rectangular shape having a predetermined width, in some cases, it may include a shape such as a circle, an ellipse or the like.

According to FIG. 6(c), in the fine depression-protrusion pattern 52, the flat unit (g) and the depression-protrusion unit (h) closed in the shape of a fence are disposed (c). The order of disposing the flat unit (g) and the depression-protrusion unit (h) may vary depending on the shape of the polarizing film 40 to which the fine depression-protrusion pattern 52 of the present invention is applied. For example, when the bezel region is large, the depression-protrusion unit (h) may be mainly disposed in the bezel region. In this way, the areas of the flat unit (g) and the depression-protrusion unit (h) constituting the fine depression-protrusion pattern 52 may be appropriately adjusted, respectively. Although the shape of the fence in the drawing is a rectangular shape having a predetermined thickness, in some cases, the shape may be modified to a wave shape or the like.

According to FIG. 6(d), in the fine depression-protrusion pattern 52, one among the flat unit (g) and the depression-protrusion unit (h) passes through some of the closed fence. The order of disposing the flat unit (g) and the depression-protrusion unit (h) may vary depending on the shape of the polarizing film 40 to which the fine depression-protrusion pattern 52 of the present invention is applied. For example, when the bezel region is large, the depression-protrusion unit (h) may be mainly disposed in the bezel region. In this way, the areas of the flat unit (g) and the depression-protrusion unit (h) constituting the fine depression-protrusion pattern 52 may be appropriately adjusted, respectively. Although the shape of the fence in the drawing is a rectangular shape having a predetermined thickness, in some cases, the shape may be modified to a wave shape or the like.

When the detachable layer 60 is attached to the adhesion control layer 50 having the fine depression-protrusion pattern 52 according to an embodiment of the present invention, the adhesive of the detachable layer 60 penetrates into the space of the fine depressions and protrusions, and the opaque screen becomes transparent. Accordingly, although the fine depression-protrusion pattern 52 having fine depressions and protrusions is used, clarity of the screen in the transparent state can be continuously maintained. The fine depression-protrusion pattern 52 may freely control the adhesive force which affects attachment and detachment of the detachable layer 60 by adjusting the proportion of the fine depressions and protrusions.

The fine depressions and protrusions of the fine depression-protrusion pattern 52 are formed in various ways. For example, they may be formed by mixing translucent beads such as silica or the like with ultraviolet or thermosetting resin, and coating and curing the mixture on the adhesion control layer 50. In addition, they may be formed by pressing and curing a sheet or roll mold engraved with a fine depression-protrusion shape coated with an ultraviolet or thermosetting resin. The fine depression-protrusion pattern 52 having fine depressions and protrusions may be manufactured by transferring a film or a sheet coated with ultraviolet or thermosetting resin or the like. The fine depression-protrusion pattern 52 may be formed by shaping using a mold of a shape matching the fine depressions and protrusions.

In addition, the fine depressions and protrusions may be formed by irradiating the surface of the adhesion control layer 50 using a laser beam. They may be formed by printing on the surface of the adhesion control layer 50 using an ultraviolet or thermal curing ink. The fine depressions and protrusions may be formed on the surface of the adhesion control layer 50 by applying a physical impact on the surface. In the case of the fine depression-protrusion pattern 52, it may formed by coating a resin or the like after masking or forming fine depressions and protrusions by exposure, etching or the like, and removing the mask. In addition to the methods described above, other methods may be applied within the scope of the present invention as a method of forming the fine depressions and protrusions.

The polarizing film 40 of the display device 100 of the present invention is separately manufactured and protected by a release film. The release film is removed to attach the detachable layer 60 of the polarizing film 40 to the fine depression-protrusion pattern 52. When the release film is removed, the detachable pattern 60 is exposed. At this point, the fine depression-protrusion pattern 52 having fine depressions and protrusions formed thereon has an effect of anti-fingerprint, anti-pollution, anti-reflection and the like by itself, and also has an effect of stably attaching and detaching the detachable layer 60 without impairing clarity of the screen owing to the fine depressions and protrusions.

FIG. 7 is cross-sectional views showing examples of fine depressions and protrusions of a fine depression-protrusion pattern 52 applied to a display device according to an embodiment of the present invention.

According to FIG. 7, various shapes of fine depressions and protrusions are formed on the fine depression-protrusion pattern 52. Here, some examples thereof are presented. Here, fine depression-protrusion patterns 52 formed in any one shape having a cross section selected among a rectangle 52a, a triangle 52b, and a circle 52c, or made of beads or beads and a binder 52d are provided for example. That is, the cross section of the fine depressions and protrusions 52a to 52d may have an angle, a curvature, or a combination these. When the fine depressions and protrusions 52a to 52d are formed on the fine depression-protrusion pattern 52, the fine depression-protrusion pattern 52 is translucent, and light transmittance is lowered. The depression-protrusion pattern 52 including the fine depressions and protrusions 52a to 52d of the lowered transmittance has a low transmittance, and is distinguished from a transparent portion without having fine depressions and protrusions 52a to 52d.

The fine depressions and protrusions 52a to 52d reveal various effects such as anti-fingerprint, anti-pollution, anti-reflection and the like. If there are fine depressions and protrusions 52a to 52d, the portions stained with fingerprints or contaminants become discontinuous and prevent formation of fingerprints and adhesion of contaminants. Specifically, although fingerprints or contaminants may be adhered on the protrusions of the fine depressions and protrusions 52a to 52d, they are not adhered to the depressions. Accordingly, the fine depressions and protrusions 52a to 52d have an effect of anti-fingerprint and anti-pollution. In addition, the fine depressions and protrusions 52a to 52d induce diffused reflection. The diffused reflection blocks external light not to be reflected from the screen of the display devices 100, 200 and 300. Furthermore, since there are depressed portions in the fine depressions and protrusions 52a to 52d, it is easy to discharge bubbles. That is, the fine depressions and protrusions 52a to 52d allow the detachable layer 60 to be stably attached to and detached from the fine depression-protrusion pattern 52.

When the detachable layer 60 is attached to the fine depression-protrusion pattern 52 having fine depressions and protrusions 52a to 52d formed therein according to an embodiment of the present invention, the adhesive of the detachable layer 60 penetrates into the space of the fine depressions and protrusions 52a to 52d, and the translucent screen is changed to be transparent. Accordingly, although the fine depression-protrusion pattern 52 having fine depressions and protrusions 52a to 52d formed therein is used, clarity of the screen in the transparent state can be maintained.

FIG. 8 is perspective views showing pattern examples of a fine depression-protrusion pattern 52 applied to a display device according to an embodiment of the present invention. At this point, the fine depressions and protrusions will be described with reference to FIG. 7.

According to FIG. 8, the fine depression-protrusion pattern 52 may be arranged in a line shape (a) 52e, a lattice shape (b) 52f, an island shape (c) 52g, or the like. Although fine depression-protrusion patterns 52 arranged to have a cross section of a rectangular shape 52a are shown for example, it may be formed in any one shape selected among a triangle 52b and a circle 52c, or may be made of beads or beads and a binder 52d. That is, the cross section of the fine depressions and protrusions 52a to 52d may have an angle, a curve, or a combination these. In addition, although the fine depression-protrusion pattern 52 may be regularly arranged while having regular intervals, it may be irregularly arranged without having regular intervals.

Meanwhile, in an embodiment of the present invention, the adhesion control pattern 51 and the fine depression-protrusion pattern 52 may be combined. For example, the concept presented in the adhesion control pattern 51 described above may be applied to the flat unit (g) of the fine depression-protrusion pattern 52 as is. The flat unit (g) of the fine depression-protrusion pattern 52 may employ the adhesion control pattern 51.

In addition, the detachable layer 60 according to an embodiment of the present invention may apply a surface-modified sheet, or a detachable sheet that is not coated with an adhesive may be applied. Accordingly, the surface-modified sheet and the detachable sheet may be examples of the detachable layer 60.

The surface-modified sheet is one in which the adhesive force on the surface is changed to be between 0.1 gf/25 mm and 500 gf/25 mm through a plasma or corona treatment or a continuous treatment thereof on the surface of a transparent polymer film. Here, the continuous treatment is preferably performed in order of plasma treatment after corona treatment. At this point, the polymer film may include, for example, any one or more among PET (polyethylene terephthalate), PEN (polyethylene naphthalate), PES (polyether sulfone), PI (polyimide), PAR (polyarylate), PC (polycarbonate), PMMA (polymethyl methacrylate), and COC (cycloolefin copolymer).

In the case of the plasma treatment, a plasma method such as atmospheric pressure plasma, low pressure plasma, corona plasma or the like is used. That is, in order to improve the adhesive force of the polymer film, the surface is chemically cleaned, and organic materials on the surface is removed by chemical reaction and physical reaction while activating the surface. The polymer film that has gone through the plasma treatment changes the chemical bond in a region within a few μm from the surface using high energy of ions or electrons. In addition, the surface is cut as much as a predetermined thickness to increase the contact angle. The surface of the polymer film is chemically or physically activated to react well with other materials. The surface-modified sheet that has gone through the plasma treatment like this is subjected to surface modification such as surface cleaning of removing fine foreign substances, change of surface roughness, formation of polar functional groups and the like.

In the case of the corona treatment, the adhesive force of the surface of the polymer film to be treated is improved using a corona discharge technique. When the polymer film is treated using corona, the surface of the film is oxidized as the charged particles in the corona collide with the film surface. Accordingly, as the surface energy of the film is increased by the polar groups generated by the surface oxidation, such as C=O, C—O—H, COOH, —COO—, —CO— and the like, and thus the affinity with the conductive polymer material is improved, adhesiveness of the film is improved. In addition, as a crosslinking structure is formed between the polymer molecules by the corona treatment, in addition to the chemical polar groups described above, improvement of adhesiveness may be obtained. Generally, the corona surface treatment manufactures the surface-modified sheet having an adhesive force of 0.1 gf/25 mm to 500 gf/25 mm on the surface, by placing a polymer film between both electrodes where corona discharge occurs and supplying a predetermined power to the both electrodes to generate corona discharge.

The detachable sheet is an adhesive sheet attached to the window 70 in the form of a sheet, not coating. The detachable sheet may be a sheet made of any one among an adhesive made by mixing a crosslinking agent with a thermosetting resin, i.e., an acrylic polymer, a silicon polymer or a urethane polymers, or an ultraviolet curable resin, a mixture of these, and a copolymer of these. For example, there is an acrylic polymer compound which copolymerizes monomer components including (a) a (meth) acrylic acid ester-based monomer having a hydrocarbon group of 1 to 12 carbon atoms, (b) a (meth) acrylic acid ester-based monomer containing a hydroxy group, (c) a monomer having an amide group, and (d) a vinyl ester monomer, and has a resin acid value of 0.1 mgKOH/g or less and a permittivity of 3 to 6. In addition, the detachable sheet may be a light-transmitting pressure sensitive adhesive sheet, or a cross-linked silicone type adhesive sheet, which are characterized by being a silicone gel.

In addition, the detachable sheet includes a sheet made of an adhesive composition including an acrylic polymer of a specific molecular weight, which does not contain an acid component containing alkoxyalkyl acrylate as a main monomer, and a crosslinking agent, and a transparent adhesive sheet containing, at a solid ratio, 65 to 85 mass % of (meth) acrylic resin, 10 to 30 mass % of polyoxyalkylene polyol, 1.0 to 5.0 mass % of polyisocyanate, and 0.005 to 0.1 mass % of tin-based catalyst, and having 0 to 5 mgKOH/g of acid value, 100,000 to 600,000 of weight average molecular weight of (meth) acrylic resin, and 500 to 1500 of the number average molecular weight of (B) polyoxyal alkylene polyol.

A hydrogel-type sheet is possible. For example, a hydrogel mainly containing a copolymer of a siloxane prepolymer and a hydrophilic monomer is preferable. The hydrogel is optically transparent and homogeneous. Of course, in order to give an adhesive force to the hydrogel, a material such as a predetermined elastomer can be mixed. The elastomer has properties of rubber at room temperature, but plasticity is exhibited as it is gradually plasticized at a high temperature. Thermoplastic elastomers exist in the form of elastic rubber lacking of crosslinking. Particularly, olefin-based thermoplastic elastomer is a material which combines olefin-based resin, such as polyethylene, polypropylene or the like, with olefin-based rubber (e.g., EDPM, ethylene propylene diene monomer) as a main component.

Since the detachable sheet according to an embodiment of the present invention is a sheet type having an adhesive force of 0.1 gf/25 mm to 500 gf/25 mm, it can be easily attached to and detached from the polarizing film 40 compared to a coating process. That is, the detachable sheet only needs to be attached to the polarizing film 40 in a proper size. The thickness of each detachable sheet is acceptable as long as the attachment and detachment are performed sufficiently, and 10 to 200 μm is preferable. It is apparent that the thickness can be obtained through repeated experiments by those skilled in the art.

While the present invention has been described above with reference to preferred embodiments, the present invention is not to be limited to the embodiments, and various modifications may be made by those skilled in the art within the scope of the present invention.

The invention claimed is:

1. A detachable display device including a touch screen, a polarizing film, and a window, the device comprising:
a polarizing film;
an adhesion control layer disposed on the polarizing film; and
a detachable layer disposed on the adhesion control layer, wherein the adhesion control layer is disposed between the polarizing film and the detachable layer,
wherein the adhesion control layer comprises: any one of an adhesion control pattern formed to face the detachable layer and having a variable contact angle, a fine depression-protrusion pattern formed to face the detachable layer and to which an adhesive of the detachable layer is penetrated, and a combination of the adhesion control pattern and the fine depression-protrusion pattern, thereby being able to adjust an adhesive force of the detachable layer having an adhesive force of 0.1 gf/25 mm to 500 gf/25 mm.

2. The device according to claim 1, wherein the adhesion control pattern is divided into a first region having a first contact angle and a second region having a second contact angle larger than the first contact angle.

3. The device according to claim 2, wherein the second region includes: any one selected from the group consisting of a fluorine-based resin, a silicone-based resin, a fluorine-based resin on a deposition layer made of titania ($TiO_2$) or silica ($SiO_2$), and a silicone-based resin on a deposition layer made of titania ($TiO_2$) or silica ($SiO_2$).

4. The device according to claim 1, wherein the adhesion control pattern is arranged in a line shape, a lattice shape, an island shape, or a combination thereof.

5. The device according to claim 1, wherein the fine depression-protrusion pattern includes: depressions and protrusions, a cross section of the depressions and the protrusions having an angle, a curvature or a combination thereof.

6. The device according to claim 1, wherein the fine depression-protrusion pattern is arranged in a line shape, a lattice shape, an island shape, or a combination thereof.

7. The device according to claim 1, wherein the fine depression-protrusion pattern is formed at an edge or ups and downs of a curved surface.

* * * * *